(12) United States Patent
Basra et al.

(10) Patent No.: US 6,375,063 B1
(45) Date of Patent: Apr. 23, 2002

(54) MULTI-STEP STUD DESIGN AND METHOD FOR PRODUCING CLOSELY PACKED INTERCONNECTS IN MAGNETIC RECORDING HEADS

(75) Inventors: Vijay K. Basra, Reading; Lawrence G. Neumann, Lancaster, both of MA (US)

(73) Assignee: Quantum Corporation, Milpitas, CA (US)

( * ) Notice: Subject to any disclaimer, the term of this patent is extended or adjusted under 35 U.S.C. 154(b) by 0 days.

(21) Appl. No.: 09/354,825

(22) Filed: Jul. 16, 1999

(51) Int. Cl.[7] ............................ G11B 5/127; H04R 31/00
(52) U.S. Cl. .................. 228/215; 430/312; 29/603.01; 360/110
(58) Field of Search ................. 228/175, 4.5, 180.5, 228/214, 215; 430/312, 315; 360/110; 29/603.01, 603.06

(56) References Cited

U.S. PATENT DOCUMENTS

| | | | |
|---|---|---|---|
| 3,853,715 A | * | 12/1974 | Romankiw |
| 4,281,057 A | * | 7/1981 | Castellani et al. |
| 4,315,985 A | * | 2/1982 | Castellani et al. |
| 4,391,849 A | * | 7/1983 | Bischoff |
| 4,436,593 A | * | 3/1984 | Osborne et al. |
| 4,454,014 A | * | 6/1984 | Bischoff |
| 4,517,616 A | * | 5/1985 | Bischoff |
| 5,468,595 A | * | 11/1995 | Livesay |
| 5,665,251 A | * | 9/1997 | Robertson et al. |
| 5,800,967 A | * | 9/1998 | Watterson |
| 5,805,392 A | * | 9/1998 | Mallary et al. |
| 5,940,253 A | * | 8/1999 | Mallary et al. |

* cited by examiner

Primary Examiner—Tom Dunn
Assistant Examiner—Kiley Stoner
(74) Attorney, Agent, or Firm—William J. Kubida; Kathy S. Willis

(57) ABSTRACT

A multi-step stud design and method for fabricating the same of special utility for producing closely packed interconnects in magnetic recording heads, particularly higher density magnetoresistive and giant magnetoresistive tape heads. The multi-step stud fabrication process and structure enables the achievement of significantly higher interconnect densities resulting in an increased number of channels per millimeter on a single computer mass storage device recording head. A resultant stronger encapsulation surrounding the stud further provides increased channel reliability. The improved uniformity of the photoresist aperture achieved for each step in the stud structure, and lower current spreading resistance because of the wider underlying stud base size, increases stud uniformity resulting in improved stud yields. This increased yield compared with conventional single step stud processes reduces cost, even with the additional photolithography and plating processes involved.

12 Claims, 3 Drawing Sheets

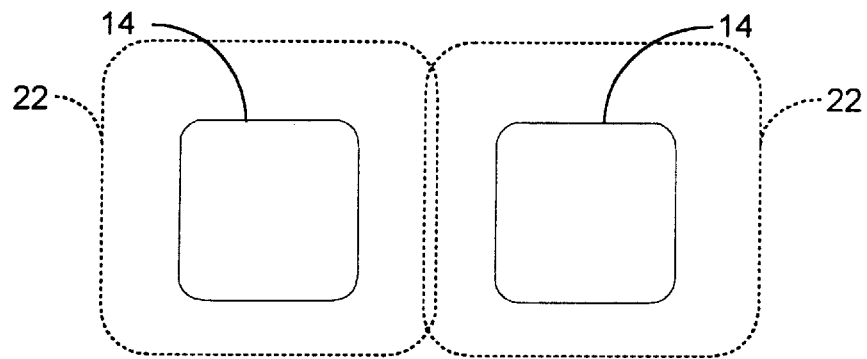
Fig. 3
Prior Art
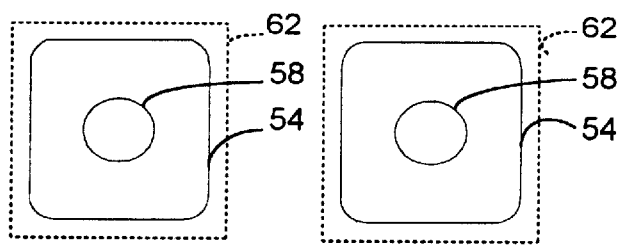
Fig. 4
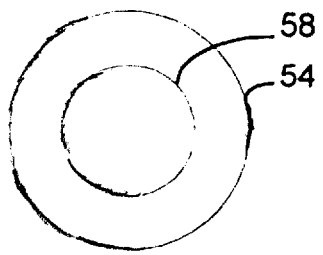 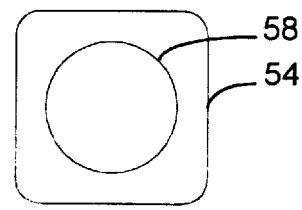
Fig. 5A  Fig. 5B

MULTI-STEP STUD DESIGN AND METHOD FOR PRODUCING CLOSELY PACKED INTERCONNECTS IN MAGNETIC RECORDING HEADS

BACKGROUND OF THE INVENTION

The present invention relates, in general, to the field of magnetic recording heads for computer mass storage devices. More particularly, the present invention relates to a multi-step stud design, and method of especial utility for producing closely packed interconnects in magnetic recording heads.

Current thin film magnetic tape recording heads consist of many channels that are closely packed together on a single head. Each channel consists of a "reader" element and a "writer" element merged on top of each other or interleaved. Each reader and writer requires a minimum of one pair of interconnect leads to the drive channel electronics, although in certain applications, several devices may share common leads such as in single-ended write heads having a common ground. At the end of each lead there is typically a stud that is plated up to a height that allows encapsulation of the head followed by planarization of the wafer topography (i.e. by lapping) which exposes the studs through the top of the insulating encapsulation material, followed by a wire bonding operation.

As the demand for higher track densities increases, the number of channels per head and channel densities likewise increases. This necessitates the fabrication of high density interconnects with high integrity. Conventional stud fabrication techniques have inherent limitations in density because of the aspect ratios required in photolithography for the fabrication of the studs. Also, current stud structures produce sufficient shadowing during the encapsulation deposition process such that there are potential chipping and reliability problems with the encapsulation surrounding the stud following lapping of the structure to the final stud height. Therefore, in order to achieve higher densities, improved uniformity of plated stud height and acceptable coverage with encapsulation are required to produce sufficiently high yields.

Studs on disk drive heads are generally larger and spaced further apart than on tape heads, since there are usually only four pads per slider. In contrast, multi-channel tape heads presently require many more pads and have interconnects that spread out from the transducers to the pads.

SUMMARY OF THE INVENTION

The multi-step stud design and method for use with closely packed interconnects in magnetic recording heads of the present invention enables more channels to be fabricated per head and allows for the provision of higher density interconnects saving considerably in wafer area. These factors, together with an improved stud shape, increases yield during fabrication while improving the long term reliability of the head.

Particularly disclosed herein is an interconnect stud structure in a magnetic recording head of a computer mass storage device which comprises a first metal layer having a first width thereof, the first metal layer being electrically coupled to at least one element (such as channel, ground or other structure) of the recording head. A second metal layer overlies the first metal layer and has a second differing width, with the second metal layer presenting an upper portion thereof for providing an electrical contact to the first metal layer. An encapsulating layer surrounds the first and second metal layers with the upper surface of the second metal layer exposed and available to permit electrical connection to the recording head.

Also particularly disclosed herein is a process for fabricating an electrical interconnect in a magnetic recording head which comprises the steps of: producing a first metal layer having a first width in electrical contact with at least one element (such as channel, ground or other structure) of the magnetic recording head; further producing a second metal layer having a second width overlying the first metal layer; encapsulating side portions of the first and second metal layers such that the encapsulation boundaries between neighboring studs do not intersect; and an upper surface of the second metal layer provides an electrical contact to the recording head.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 3 is a partially cut-away top plan view of the stud structure of FIG. 1B illustrative of the fact that an undesirably larger stud structure is produced with a concomitantly greater lateral growth of the encapsulation phase boundary which may interfere or overlap with that of an adjacent stud;

FIG. 4 is a partially cut-away top plan view of the stud structure of FIG. 2C illustrative of the fact that a smaller stud top portion is produced with a concomitantly reduced lateral encapsulation phase boundary that allows for closer spacing to adjacent studs;

FIG. 5A is a partially cut-away top plan view of a multi-step stud in accordance with one embodiment of the present invention wherein a substantially circular cross-section first metal layer is overlaid with an additional substantially circular cross-section second metal layer; and FIG. 5B is a partially cut-away top plan view of a multi-step stud in accordance with another embodiment of the present invention wherein a substantially rectilinear cross-section first metal layer is overlaid with an additional substantially circular cross-section second metal layer.

DESCRIPTION OF A PREFERRED EMBODIMENT

Figure 1A:
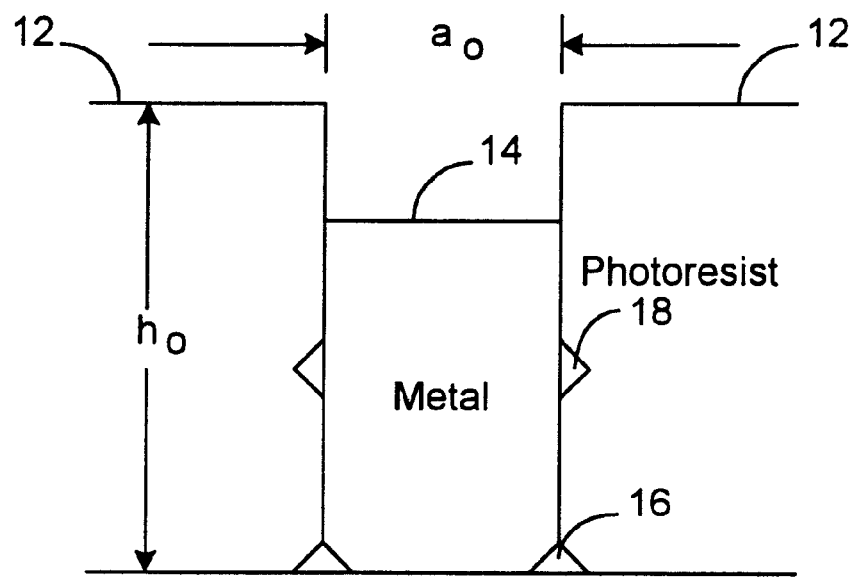
FIG. 1A is a side plan view of a portion of the process flow for the fabrication of a conventional stud for use in conjunction with the interconnects of a magnetic recording head illustrating the structure following photolithography and electroplating operations.

With reference now to FIG. 1A, a side plan view of a portion of the process flow for the fabrication of a conventional stud structure 10 is shown following photolithography and electroplating operations. As illustrated, photoresist 12 is patterned to a height of $h_0$ to allow for the formation of a metal layer 14 to form an interconnect lead stud having a width $a_0$. A conventional fabrication process may lead to a substantial and undesired photoresist "foot" and "eyelash" region 16 as well as the possibility of various other artifacts 18 due to the multiple photoresist operations required to produce photoresist with a height $h_0$. In the typical embodiment of the stud structure 10 shown, $a_0$ may be on the order of 40 microns, (although values of 75 μm are more typical) while the height $h_0$ of the photoresist 12 is on the order of 60 microns, resulting in a height of the metal layer 14 being on the order of about 40–50 microns.

As studs need to be produced in closer proximity to each other, a single step stud structure 10 cannot be exposed to the same aspect ratio with current thick photoresist 12 processes. Problems such as resist residue, non-uniformity of the opening cross-section with depth and uncontrolled resist foot (different than resist residue) results. The effect of these photolithographic issues results in incomplete electroplating, non-uniform plated heights and irregular plated stud shapes for small openings.

Figure 1B:
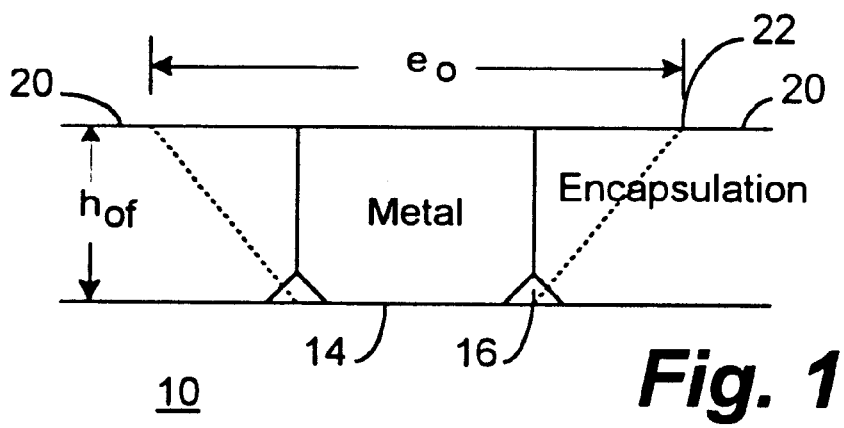
FIG. 1B is a follow-on side plan view of the stud illustrated in the preceding figure following subsequent photoresist strip, encapsulation deposition and lapping operations, particularly illustrating the resultant width of the lateral encapsulation phase boundary.

With reference additionally now to FIG. 1B, a follow-on side plan view of the stud illustrated in the preceding figure is shown following subsequent photoresist strip, encapsulation 20 deposition and lapping operations. As illustrated, a conventional single step stud lapped to a height of $h_{0f}$ results in a unacceptably wide lateral encapsulation phase boundary 22 having a width $e_0$. Assuming a width $a_0$ of about 40 microns, the height $h_{0f}$ would be about 30 microns and the width $e_0$ would be between 100–120 microns.

At encapsulation of the stud, the lateral growth boundary of the encapsulation is directly proportional to the height of the single step stud to its finished lapped height ($h_{0f}$). The large lateral encapsulation growth can exceed the stud-to-stud spacing, resulting in gross chipping of the encapsulation during pad lapping operations Also, the irregular shape of the single step generally rectangular electroplated stud results in irregular encapsulation growth which is weaker in strength. The encapsulation chipping results in further problems during wire bond operations and provides a potential path for degradation of the contact due to the exposure of underlying copper to the external environment.

Figure 2A:
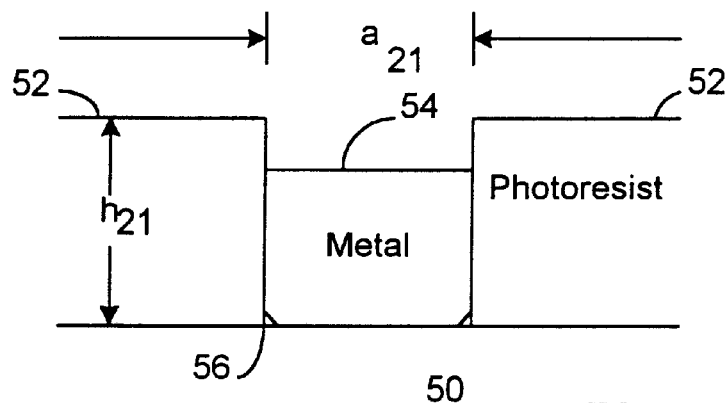
FIG. 2A is a comparative side plan view of a portion of the process flow for the fabrication of a stud in accordance with the present invention for use in conjunction with the interconnects of a magnetic recording head illustrating the structure following photolithography and electroplating operations.

With reference additionally now to FIG. 2A, a comparative side plan view of a portion of the process flow for the fabrication of a stud structure 50 in accordance with the present invention is shown following photolithography and electroplating operations. In this regard, photoresist 52 has been patterned to a height of $h_{21}$ to allow for the electroplating of a first metal layer 54 having a width $a_{21}$. As shown, utilizing a relatively thinner photoresist 52 layer to produce the first metal layer 54 results in a much improved, minimal photoresist foot and eyelash 56. In a representative embodiment, the width $a_{21}$ of the metal layer 54 may be substantially 20–60 microns while the height $h_{21}$ of the photoresist 52 may be substantially 25–30 microns.

In a preferred embodiment, the seed layer on which the first metal layer 54 is plated may be Copper (Cu), Palladium (Pd), Gold (Au), Nickel-Iron (NiFe) or other conductive compounds with various adhesion layers such as Chromium (Cr), Titanium (Ti), Titanium-Tungsten (TiW), Tantalum (Ta) or Molybdenum (Mo) and other barrier layers such as Nickel (Ni) and equivalents thereof. The substrate on which the first metal layer 54 and seed layer may be fabricated include Cu, Au, NiFe and other materials including relatively high magnetic moment materials such as cobalt-zirconium-tantalum (CoZrTa), iron-aluminum-nitride (FeAlN), iron-tantalum-nitride (FeTaN), iron nitride (FeN) and their equivalents. Alternatively, the substrate may be an insulator through which there is a contact to a buried layer. The metal studs ultimately produced, including the additional metal step layer more fully described hereinafter, may be fabricated from Cu, Au, NiFe or the equivalents thereof.

Figure 2B:
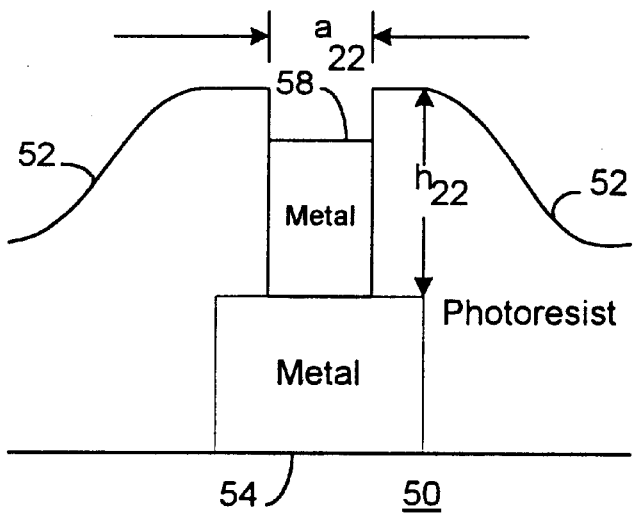
FIG. 2B is a follow-on side plan view of the stud of the preceding figure following the fabrication of an additional metal step layer overlying the first metal layer.

With reference additionally now to FIG. 2B, a follow-on side plan view of the stud structure 50 of the preceding figure is shown following the fabrication of an additional metal step layer 58 overlying the first metal layer 54. As illustrated, photoresist 52 has additionally been patterned to a height $h_{22}$ overlying a portion of the upper surface of the first metal layer 54 and patterned to enable the electroplating of the additional metal layer 58 to a width $a_{22}$. In a representative embodiment, $h_{22} \sim h_{21} \sim h_0/2$ with the width $a_{22}$ of the additional metal step layer 58 being substantially in the range of 5–40 microns and the height $h_{22}$ of the photoresist 52 overlying the first metal layer 54 being substantially in the range of 25–30 microns.

The multi-step stud fabrication technique illustrated greatly simplifies photolithography issues in that a less stringent aspect ratio is required for each step. At such reduced aspect ratios, there are significantly less resist foot and eyelash 56 in the photoresist 52. This ensures greater uniformity of plating height is achieved for the same size of opening. Since the photoresist 52 height is reduced in the second step by a factor of approximately 2, a smaller aperture is easily achieved. Standard process plasma cleaning techniques enable further gains to be provided since any residual photoresist can more easily be cleaned out of the shallower depth of the opening. As shown, the ratio of the heights of the first metal layer 54 and the additional metal layer 58 is selected to provide a minimum lateral encapsulation growth as will be further described hereinafter.

Figure 2C:
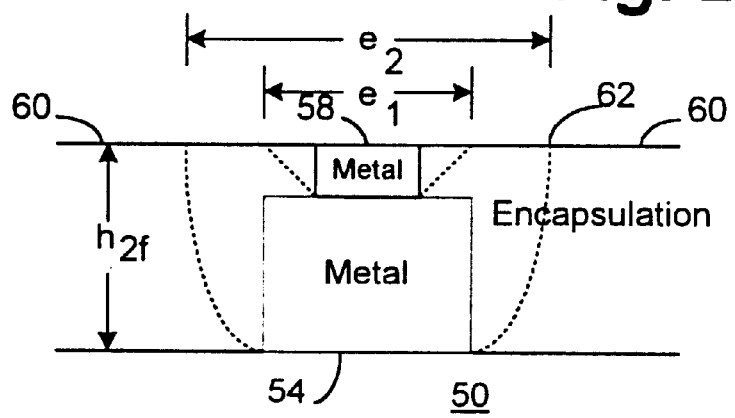
FIG. 2C is a further follow-on side plan view of the structure illustrated in the preceding figure following subsequent photoresist strip, encapsulation deposition and lapping operations, particularly illustrating the resultant narrower width and steeper slope of the lateral encapsulation phase boundary.

With reference additionally now to FIG. 2C, a further follow-on side plan view of the structure 50 illustrated in the preceding figure is shown following subsequent photoresist strip, encapsulation 60 deposition and lapping operations. As illustrated, the final height of the combined first and additional metal layers 54, 58 is $h_{2f}$, with the additional metal layer 58 producing an encapsulation phase boundary of width $e_1$ and the first metal layer 54 producing an encapsulation phase boundary 62 with a relatively steep slope and width $e_2$. In a preferred embodiment, $e_1 \ll e_0$ and $e_2 < e_0$ while $h_{2f} \sim h_{0f}$. The process of the present invention allows $h_{2f} > h_{0f}$ and $e_2 < e_0$. For the exemplary dimension ranges previously given, the height $h_{2f}$ is substantially 30 microns while the widths $e_1$ and $e_2$ are substantially 40 and 80 microns respectively. Representative ranges for thickness of the first and second metal layers 54, 58 are 15–25 and 5–15 microns respectively.

As can be seen, the encapsulation phase change boundary 62 is steeper in slope and less pronounced in the structure 50 of FIGS. 2A–2C than that in the structure 10 of FIGS. 1A–1B allowing studs to be more closely spaced together. Typically, the minimum pitch between studs fabricated utilizing the conventional approach of FIGS. 1A–1B is on the order of 100–120 μm, depending on the wafer size and on the uniformity of the encapsulation deposition across the wafer. In comparison, utilizing the technique of the present invention disclosed with respect to FIGS. 2A–2C, a much denser stud pitch of on the order of 50 $\mu$m may be obtained.

With reference additionally now to FIG. 3, a partially cut-away top plan view of the conventional stud structure of FIG. 1B is shown illustrative of the fact that an undesirably larger stud structure produced by the substantially uniform thickness metal layer 14 is produced with a concomitantly greater lateral growth of the encapsulation phase boundary 22. If studs utilizing this conventional fabrication approach are too closely spaced together, their respective encapsulation phase boundaries 22 might overlap as shown, thereby requiring a typical minimum pitch of 100–120 $\mu$m in order to obviate this potential problem.

With reference additionally now to FIG. 4, a partially cut-away top plan view of the stud structure of FIG. 2C is shown illustrative of the fact that a smaller stud top portion comprising the additional metal layer 58 formed on top of the first metal layer 54 is produced in accordance with the present invention with a concomitantly reduced lateral encapsulation phase boundary 62. This then allows studs to be produced with a much denser pitch of on the order of 50 $\mu$m without problems due to the encapsulation phase boundary 62.

With reference additionally now to FIG. 5A, a partially cut-away top plan view of a multi-step stud in accordance with one embodiment of the present invention is shown wherein a substantially circular cross-section first metal layer 54 is overlaid with an additional substantially circular cross-section second metal layer 58.

With reference additionally now to FIG. 5B, a partially cut-away top plan view of a multi-step stud in accordance with another embodiment of the present invention is shown wherein a substantially rectilinear cross-section first metal layer 54 is overlaid with an additional substantially circular cross-section second metal layer 58. With respect to the embodiments of FIGS. 5A and 5B, it should be noted that the use of a substantially circular cross-section shaped stud in the form of the additional metal layer 58 minimizes stud shadowing of the encapsulation 60 during deposition while optimizing stud cross-section.

It has also been observed that there is a benefit in spreading resistance between the stud and the underlying seed layer on which the first metal layer 54 is electroplated or otherwise formed. This benefit is proportional to the perimeter of the base of the stud. With the present invention, the size of the top of the stud can be reduced without increasing this resistance. Therefore, even if a tall and narrow (i.e. a high aspect ratio) stud could be achieved using a single layer photoresist process (as shown and described with respect to FIGS. 1A and 1B), it would not exhibit the lower spreading resistance benefits to the underlying seed layer that exist with the multi-step stud fabrication process and structure of the present invention.

Multiple step stud processes utilizing more than two metal layers would provide even greater flexibility in achieving desired interconnect packing densities although more photolithography and plating steps would be required. However, the same vacuum deposited seed layer could be used for many steps as in the two step stud fabrication process previously disclosed.

What has been provided, therefore, is a multi-step stud fabrication process and structure which enables significantly higher interconnect densities resulting in an increased number of channels per millimeter on a single computer mass storage device recording head. The resultant stronger encapsulation surrounding the stud provides increased channel reliability. Moreover, the improved uniformity of the photoresist aperture for each step and lower current spreading resistance because of the wider underlying stud base size increases stud thickness uniformity resulting in improved stud yields. Increased yield compared with conventional single step stud processes reduces cost, even with the additional photolithography and plating processes involved.

By achieving closer pad to pad spacing, higher channel densities can be achieved. The lessened lateral growth of the encapsulation at the final finished height of the stud due to reduced shadowing by adjacent studs, results in stronger and more uniform encapsulation. A higher process yield is achieved overall due to the fact that each stud needs a thinner photoresist layer for its fabrication and the less photoresist residue that is produced, the fewer undesired photolithography artifacts are produced during patterning. In the use of a substantially circular cross-section stud, a minimization of "cusping" of the encapsulation surrounding the stud is achieved and an increased stud height uniformity can be achieved due to the more consistent photoresist patterning provided. Still further, higher current spreading is achieved due to the wider width of the lower portion of the stud as compared to the top.

While there have been described above the principles of the present invention in conjunction with specific processing steps and stud structures, it is to be clearly understood that the foregoing description is made only by way of example and not as a limitation to the scope of the invention. For example, while a multi-step stud fabrication process and structure is shown comprising a two step stud structure, more than two steps can be produced to great advantage and still not depart from the teachings of the present invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A process for fabricating an electrical interconnect in a magnetic recording head comprising:

producing a first metal layer having a first width in electrical contact with at least one element of said magnetic recording head;

further producing a second metal layer having a second width overlying said first metal layer by patterning a second photoresist layer at least partially overlying an upper portion of said first metal layer and said substrate to form a second aperture therein having said second width;

forming said second metal layer on said first metal layer within said second aperture; and encapsulating side portions of said first and second metal layers such that an upper surface of said second metal layer provides an electrical contact to said at least one element.

2. The process of claim 1 wherein said step of forming said second metal layer is carried out by the step of:

plating said second metal layer on said first metal layer.

3. The process of claim 2 wherein said step of plating said second metal layer is carried out by means of Cu, Au or NiFe.

4. A process for fabricating an electrical interconnect in a magnetic recording head comprising:

producing a first metal layer having a first width in electrical contact with at least one element of said magnetic recording head;

further producing a second metal layer having a second width overlying said first metal layer, said second metal layer being produced by patterning a second photoresist layer at least partially overlying an upper portion of said first metal layer and said first layer of photoresist to form a second aperture therein having said second width; forming said second metal layer on said first metal layer within said second aperture; and encapsulating side portions of said first and second metal layers such that an upper surface of said second metal layer provides an electrical contact to said at least one element.

5. The process of claim 4 wherein said step of forming said second metal layer is carried out by the step of:

plating said second metal layer on said first metal layer.

6. The process of claim 5 wherein said step of plating said second metal layer is carried out by means of Cu, Au or NiFe.

7. A process for fabricating an electrical interconnect in a magnetic recording head comprising:

producing a first metal layer having a first width in electrical contact with at least one element of said magnetic recording head;

further producing a second metal layer having a second width overlying said first metal layer; and removing an upper portion of said encapsulation layer and said second metal layer to a predetermined depth.

8. The process of claim 7 wherein said step of removing is carried out by the step of:

lapping away said upper portion of said encapsulation layer and said second metal layer.

9. The process of claim 7 wherein said step of producing said first metal layer comprises the steps of:

patterning a first photoresist layer on a substrate to form a first aperture therein having said first width; and forming said first metal layer on said substrate within said first aperture.

10. The process of claim 7 wherein said step of forming said first metal layer comprises the steps of:

providing a seed layer; and plating said first metal layer on said seed layer.

11. The process of claim 7 wherein said step of providing said seed layer is carried out by means of Cu, Pd, Au or NiFe.

12. The process of claim 7 wherein said step of plating said first metal layer is carried out by means of Cu, Au or NiFe.

* * * * *